(12) United States Patent
Cao et al.

(10) Patent No.: US 12,406,733 B2
(45) Date of Patent: Sep. 2, 2025

(54) CONFIGURATION CONTROL CIRCUIT OF FLASH-TYPED FIELD PROGRAMMABLE GATE ARRAY (FPGA) CAPABLE OF SUPPRESSING PROGRAMMING INTERFERENCE

(71) Applicant: WUXI ESIONTECH CO., LTD., Wuxi (CN)

(72) Inventors: Zhengzhou Cao, Wuxi (CN); Yueer Shan, Wuxi (CN); Bo Tu, Wuxi (CN); Xiaofei He, Wuxi (CN); Yanfei Zhang, Wuxi (CN); Zhenkai Ji, Wuxi (CN)

(73) Assignee: WUXI ESIONTECH CO., LTD., Wuxi (CN)

( * ) Notice: Subject to any disclaimer, the term of this patent is extended or adjusted under 35 U.S.C. 154(b) by 234 days.

(21) Appl. No.: 18/348,380

(22) Filed: Jul. 7, 2023

(65) Prior Publication Data

US 2023/0352096 A1 Nov. 2, 2023

Related U.S. Application Data

(63) Continuation of application No. PCT/CN2023/083040, filed on Mar. 22, 2023.

(30) Foreign Application Priority Data

Jun. 30, 2022 (CN) .......................... 202210758609.X

(51) Int. Cl.
  *G11C 16/10* (2006.01)
  *G11C 16/04* (2006.01)
  *H03K 19/017* (2006.01)

(52) U.S. Cl.
  CPC ........ *G11C 16/102* (2013.01); *G11C 16/0433* (2013.01); *H03K 19/01721* (2013.01)

(58) Field of Classification Search
  CPC .............. G11C 16/102; G11C 16/0433; H03K 19/01721
  (Continued)

(56) References Cited

U.S. PATENT DOCUMENTS 6,980,472 B2 * 12/2005 Ditewig ................. G11C 16/26
                                                365/185.23
7,889,568 B2 * 2/2011 Watanabe .............. G11C 16/24
                                                365/185.23
(Continued)

FOREIGN PATENT DOCUMENTS

CN         107045893 A       8/2017
CN         109473140 A       3/2019
(Continued)

OTHER PUBLICATIONS

Cao Zhengzhou, et al., Programming and Disturb Inhibit Technology of Flash-Based FPGA, Semiconductor Technology, 2023, pp. 624-631, vol. 48 No.7.

*Primary Examiner* — Anthan Tran
*Assistant Examiner* — Duy H Luong
(74) *Attorney, Agent, or Firm* — Bayramoglu Law Offices LLC

(57) ABSTRACT

A configuration control circuit of a flash-type FPGA capable of suppressing programming interference is provided. The configuration control circuit adds a programming selection circuit compared with a conventional configuration control circuit. When a programming operation is performed on a flash memory cell located in a target row and a target column, the programming selection circuit controls a path between a programming bit line (BL) voltage and a BL voltage obtaining terminal of the flash memory cell located in the target row and the target column to be turned on, and a path between the programming BL voltage and a BL (Continued)

voltage obtaining terminal of a flash memory cell located in another row and the target column to be turned off.

4 Claims, 6 Drawing Sheets

(58) Field of Classification Search
USPC .................................................. 365/189.011
See application file for complete search history.

(56) References Cited

U.S. PATENT DOCUMENTS

| | | | | |
|---|---|---|---|---|
| 8,339,862 | B2* | 12/2012 | Aiika | G11C 16/12 365/185.23 |
| 2013/0215683 | A1 | 8/2013 | Lee et al. | |
| 2021/0174852 | A1 | 6/2021 | Li et al. | |
| 2021/0391012 | A1* | 12/2021 | Masuduzzaman | G11C 16/3427 |
| 2022/0157393 | A1* | 5/2022 | Park | G11C 11/5671 |
| 2023/0162798 | A1* | 5/2023 | Li | G11C 16/10 365/189.011 |

FOREIGN PATENT DOCUMENTS

| | | | |
|---|---|---|---|
| CN | 111312312 | A | 6/2020 |
| CN | 113168877 | A | 7/2021 |
| CN | 113990376 | A | 1/2022 |
| CN | 114282470 | A | 4/2022 |
| CN | 115083493 | A | 9/2022 |
| CN | 115099178 | A | 9/2022 |

* cited by examiner

CONFIGURATION CONTROL CIRCUIT OF FLASH-TYPED FIELD PROGRAMMABLE GATE ARRAY (FPGA) CAPABLE OF SUPPRESSING PROGRAMMING INTERFERENCE

CROSS REFERENCE TO THE RELATED APPLICATIONS

This application is a continuation application of International Application No. PCT/CN2023/083040, filed on Mar. 22, 2023, which is based upon and claims priority to Chinese Patent Application No. 202210758609.X, filed on Jun. 30, 2022, the entire contents of which are incorporated herein by reference.

TECHNICAL FIELD

The present disclosure relates to the field of flash-type field programmable gate arrays (FPGAs), and in particular, to a configuration control circuit of a flash-type FPGA capable of suppressing programming interference.

BACKGROUND

Based on a reconfigurable flash-type storage technology, a flash-type FPGA completes configurations of circuit logic through re-downloading and programming to achieve different functions for a user. Compared with a conventional static random access memory (SRAM)-type programmable logic device, the flash-type FPGA has advantages such as no loss of power failure information, fast power-on and startup, simple peripheral circuits, and a short development cycle, and gradually becomes a new trend of a programmable logic device.

Similar to the SRAM-type programmable logic device, the flash-type FPGA in design requires layout, wiring, timing analysis, and other operations based on a user design to ultimately obtain a design result that meets a timing requirement. However, in a process of producing the flash-type FPGA based on the design result, when a high voltage is applied to a flash switch to perform a programming operation, a previously programmed flash switch is affected, causing a drift in a threshold voltage of the previously programmed flash switch, and increasing a signal transmission delay of the flash switch. As a result, the design result that is originally supposed to meet the timing requirement no longer meets the timing requirement after the production, resulting in decreasing of an operating frequency of a circuit.

SUMMARY

Technical Problems

In a process of producing a flash-type FPGA based on a design result, when a high voltage is applied to a flash switch to perform a programming operation, a previously programmed flash switch is affected, causing a drift to a threshold voltage of the previously programmed flash switch, and increasing a signal transmission delay of the flash switch. As a result, the design result that is originally supposed to meet a timing requirement no longer meets the timing requirement after the production, resulting in decreasing of an operating frequency of a circuit.

Technical Solutions

To resolve the above problems and meet the above technical requirements, the inventor proposes a configuration control circuit of a flash-type FPGA for suppressing programming interference. The technical solutions of the present disclosure are as follows:

A configuration control circuit of a flash-type FPGA capable of suppressing programming interference is provided, where the configuration control circuit includes a word line (WL) circuit, a bit line (BL) circuit, and a programming selection circuit;

the WL circuit includes a plurality of WL channels, and each of the plurality of WL channels corresponds to one row of a memory array, and is configured to provide a WL voltage to each flash memory cell in the corresponding row;

the BL circuit includes a plurality of BL channels, and each of the plurality of BL channels corresponds to one column of the memory array, and is configured to provide a BL voltage to each flash memory cell in the corresponding column by using the programming selection circuit; and when a programming operation is performed on a flash memory cell located in a target row and a target column, a programming WL voltage is provided through a WL channel corresponding to the target row, and a programming BL voltage is provided through a BL channel corresponding to the target column; and the programming selection circuit controls a path between the programming BL voltage and a BL voltage obtaining terminal of the flash memory cell located in the target row and the target column to be turned on, and a path between the programming BL voltage and a BL voltage obtaining terminal of a flash memory cell located in another row and the target column to be turned off.

As a further technical solution, the programming selection circuit includes a plurality of selection channels and a plurality of selection transistors, each of the plurality of selection transistors corresponds to one flash memory cell, a drain of the selection transistor is connected to the BL voltage obtaining terminal of the corresponding flash memory cell, and sources of selection transistors connected to all flash memory cells in a same column are connected to each other and connected to a BL channel corresponding to the column; and each of the plurality of selection channels corresponds to one row of the memory array, and gates of selection transistors connected to all flash memory cells in a same row are connected to each other and connected to a selection channel corresponding to the row; and the programming selection circuit outputs a valid-level selection voltage through a selection channel corresponding to the target row, and outputs an invalid-level selection voltage through a selection channel corresponding to the another row.

As a further technical solution, each of the plurality of selection channels includes a first programming switch transistor, a pull-up selection switch transistor, a second programming switch transistor, and a pull-down selection switch transistor, where a supply voltage VDD, the pull-up selection switch transistor, the first programming switch transistor, the second programming switch transistor, the pull-down selection switch transistor, and a negative high voltage LV1 are sequentially connected, and a common terminal of the first programming switch transistor and the second programming switch transistor is led out to connect the gates of the selection transistors connected to the flash memory cells in the corresponding row;

the second programming switch transistor is controlled by a programming operation signal, the first programming switch transistor is controlled by a complementary signal of the programming operation signal, and both the pull-up selection switch transistor and the pull-down selection switch transistor are controlled by a gating trigger signal;

when the programming operation is performed on the flash-type FPGA, the programming operation signal has a valid level, second programming switch transistors of all the selection channels are turned on, and first programming switch transistors of all the selection channels are turned on;

a gating trigger signal in the selection channel corresponding to the target row has the valid level, the pull-down selection switch transistor in the current selection channel is turned on, the pull-up selection switch transistor in the current selection channel is turned off, and the current selection channel outputs the negative high voltage LV1 to a gate of a selection transistor connected to the flash memory cell in the target row to control the selection transistor to be turned on; and a gating trigger signal in the selection channel corresponding to the another row has an invalid level, the pull-up selection switch transistor in the selection channel is turned on, the pull-down selection switch transistor in the selection channel is turned off, and other selection channels each output the supply voltage VDD to a gate of a selection transistor connected to a flash memory cell in each row to control the selection transistor to be turned off.

As a further technical solution, each of the plurality of selection channels further includes an erasure reading switch transistor, where the common terminal of the first programming switch transistor and the second programming switch transistor is grounded through the erasure reading switch transistor, and the erasure reading switch transistor is controlled by an erasure reading signal;

when the programming operation is performed on the flash-type FPGA, the programming operation signal has the valid level and the erasure reading signal has the invalid level; when an erasure operation or a data reading operation is performed on the flash-type FPGA, the programming operation signal has the invalid level, the second programming switch transistors of all the selection channels are turned off, and the first programming switch transistors of all the selection channels are turned off; and the erasure reading signal has the valid level, erasure reading switch transistors of all the selection channels are turned on, and all the selection channels output 0 V.

As a further technical solution, the pull-up selection switch transistor includes a P-channel metal oxide semiconductor (PMOS) transistor P9, and the pull-down selection switch transistor includes an N-channel metal oxide semiconductor (NMOS) transistor N13, where a source of the P9 is connected to the supply voltage VDD, a drain of the P9 is connected to the first programming switch transistor, and a gate of the P9 is connected to the gating trigger signal ADDR; and the second programming switch transistor is connected to a drain of the N13, a source of the N13 is connected to the negative high voltage LV1, and a gate of the N13 is connected to the signal ADDR; and the signal ADDR in the selection channel corresponding to the target row has the valid level, while the signal ADDR in the selection channel corresponding to the another row has the invalid level.

As a further technical solution, the flash-type FPGA includes a plurality of configuration control circuits, and each of the plurality of configuration control circuits is correspondingly connected to a memory array in one bank of the flash-type FPGA;

each of the plurality of selection channels further includes a first bank selection transistor and a second bank selection transistor, where the first bank selection transistor is connected between the supply voltage VDD and an output terminal of the selection channel, and the second bank selection transistor is connected between the output terminal of the selection channel and the negative high voltage LV1; and when a configuration operation is performed on a memory array in a bank, a bank signal obtained by a configuration control circuit in the bank has the valid level, and first bank selection transistors and second bank selection transistors in all selection channels in the bank are turned on.

Advantages

The present disclosure provides a configuration control circuit of a flash-type FPGA capable of suppressing programming interference. The configuration control circuit adds a programming selection circuit compared with a conventional configuration control circuit. The programming selection circuit can be used to disconnect a path between a BL voltage and a flash memory cell in an unselected row during programming, so as to prevent a high programming BL voltage from acting on an unselected flash memory cell, and suppress resulting programming interference. A part of chip area is sacrificed to improve consistency of a threshold voltage distribution after the flash memory cell is programmed, which avoids a drift of a threshold voltage of the flash memory cell, avoids an additional delay caused by a programming process, and ensures accuracy of a delay of using the flash memory cell as a signal switch to transmit a signal. The configuration control circuit is suitable for a flash-type FPGA with high performance and a high resource utilization rate.

DETAILED DESCRIPTION OF THE EMBODIMENTS

Specific implementations of the present disclosure will be further described with reference to the accompanying drawings.

Figure 1:
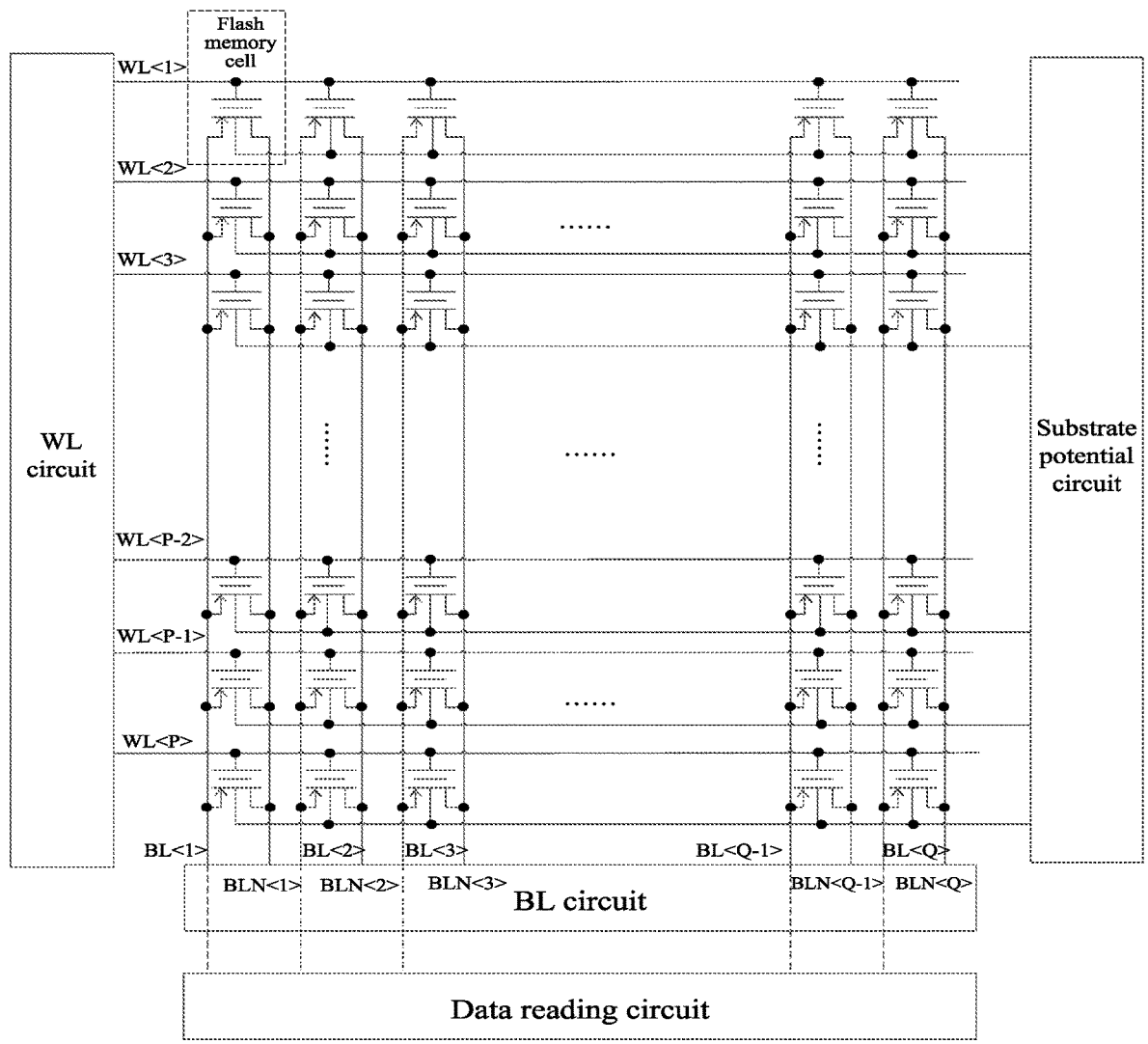
FIG. 1 is a schematic structural diagram of a memory array and a configuration control circuit inside a conventional flash-type FPGA.

Referring to a structural diagram shown in FIG. 1, in a memory array and a configuration control circuit that are included in a conventional flash-type FPGA, an example in which the memory array includes flash memory cells of P rows and Q columns is used. A WL circuit is connected to flash memory cells from a first row to a $P^{th}$ row through WL<1> to WL<P>, and a BL circuit is connected to BL voltage obtaining terminals of flash memory cells from a first column to a $Q^{th}$ column through BL<1> to BL<Q>. The BL circuit is also connected to bit line negate (BLN) terminals of the flash memory cells from the first column to the $Q^{th}$ column through BLN<1> to BLN<Q>. A substrate circuit is connected to substrate SUB of each flash memory cell. A data reading circuit is connected to a BL voltage obtaining terminal of each flash memory cell.

In the conventional flash-type FPGA including the conventional configuration control circuit in FIG. 1, the BL circuit directly provides a BL voltage to each flash memory cell. During programming in sequence from the first row to a last row, when a programming operation is performed on flash memory cells in each row, a BL voltage provided by a BL channel acts on all flash memory cells in a same column. When the programming operation is performed, the BL voltage is a high voltage, which causes programming interference when being applied to an already-programmed flash memory cell, causing a drift to a threshold voltage of a previously programmed flash switch. For example, when the programming operation is performed on each flash memory cell in the first column, the BL circuit applies a high voltage to P flash memory cells in the first column through the BL<1>. Therefore, when the programming operation is performed on a flash memory cell located in the second row and the first column, the programming interference is caused to an already-programmed flash memory cell located in the first row and the first column. Similarly, when the programming operation is performed on a flash memory cell located in the first column and the third row, the programming interference is caused to the already-programmed flash memory cell located in the first column and the first row and the already-programmed flash memory cell located in the first column and the second row, and so on.

Figure 2:
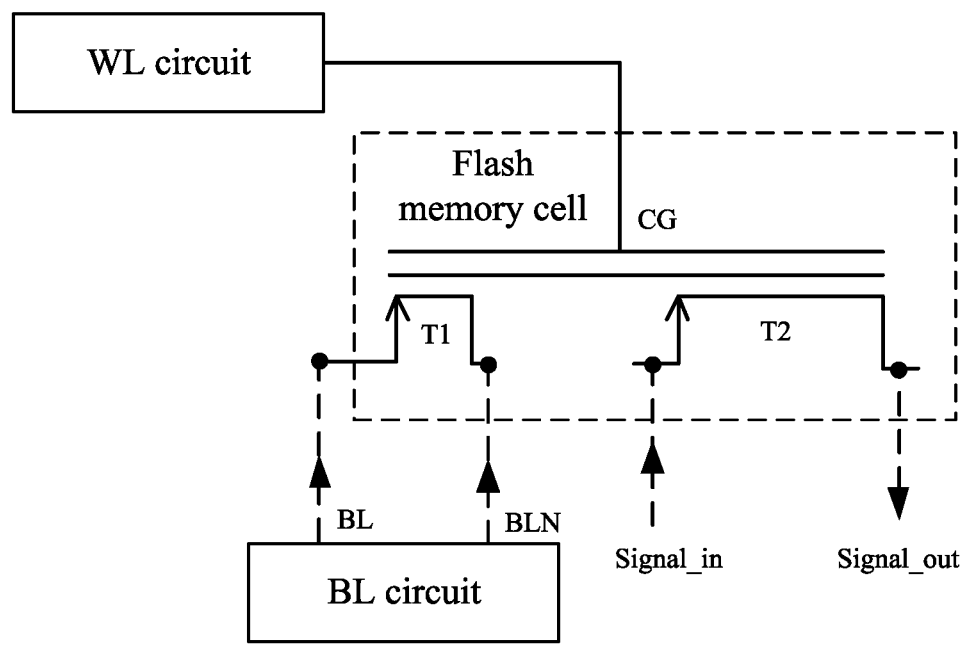
FIG. 2 is another structural diagram of a flash memory cell.

In the structure shown in FIG. 1, each flash memory cell may be of a single-transistor structure shown in FIG. 1. A drain of the flash memory cell is connected to a BL as the BL voltage obtaining terminal, a source of the flash memory cell is connected to a BLN, a gate of the flash memory cell is connected to the WL circuit, and the substrate of the flash memory cell is connected to the substrate circuit. Alternatively, each flash memory cell may be of a dual-transistor structure shown in FIG. 2. The flash memory cell includes programming transistor T1 and switch transistor T2. Floating gates of the programming transistor T1 and the switch transistor T2 are connected to serve as control gate CG of a switch unit to connect the WL circuit. A source of the programming transistor T1 is connected to the BL voltage as the BL voltage obtaining terminal, while a drain of the programming transistor T1 is connected to the BLN. The substrate of the flash memory cell is connected to a substrate potential circuit. For a source and a drain of the switch transistor T2, one serves as signal input terminal Signal_in, and the other serves as signal output terminal Signal_out, to achieve bidirectional communication.

In order to suppress the programming interference, a configuration control circuit in the present disclosure is optimized based on the conventional configuration control circuit, and adds a programming selection circuit compared with the conventional configuration control circuit. A memory array in a flash-type FPGA containing the configuration control circuit in the present disclosure also includes a plurality of flash memory cells. Similar to the conventional structure, the flash memory cell may be of the single-transistor structure shown in FIG. 1 or the dual-transistor structure shown in FIG. 2. In addition to the conventional WL circuit, BL circuit, substrate circuit, and data reading circuit, the configuration control circuit also includes the programming selection circuit. The configuration control circuit is configured to perform configuration operations on the flash memory cell in the memory array, including a programming operation, an erasure operation, and a data reading operation.

A method for connecting the WL circuit and the flash memory cell is similar to the conventional method. The WL circuit includes a plurality of WL channels. Each of the plurality of WL channels corresponds to one row of the memory array, and is configured to provide a WL voltage to each flash memory cell in the corresponding row. When different configuration operations are performed, the WL voltage has different values. A method for connecting the substrate circuit and the memory array and a method for connecting the data reading circuit and the memory array are also the same as the conventional methods, and details are not described again in the present disclosure.

The BL circuit includes a plurality of BL channels. Each of the plurality of BL channels corresponds to one column of the memory array, and is configured to provide a BL voltage to each flash memory cell in the corresponding column. When different configuration operations are performed, the BL voltage has different values. A method for connecting the BL circuit and the flash memory cell is different from the conventional method. Each BL channel is no longer directly connected to each flash memory cell in the corresponding column through a BL, but provides the BL voltage to each flash memory cell in the corresponding column by using the programming selection circuit. A BLN provided by the BL channel to each flash memory cell is similar to the conventional one, and details are not described again in the present disclosure.

In a process of programming the memory array, the flash memory cell is selected and programmed in sequence. When the programming operation is performed on a flash memory cell located in a target row and a target column, a programming WL voltage is provided through a WL channel corresponding to the target row, and a programming BL voltage is provided through a BL channel corresponding to the target column. The programming WL voltage and the programming BL voltage are respectively a required WL voltage and BL voltage for programming. The programming selection circuit controls a path between the programming BL voltage and a BL voltage obtaining terminal of the flash memory cell located in the target row and the target column to be turned on, and a path between the programming BL voltage and a BL voltage obtaining terminal of a flash memory cell located in another row and the target column to be turned off.

For example, for the memory array in FIG. 1, when the programming operation is performed on a flash memory cell located in a fifth row and a sixth column, WL channel 5 provides the programming WL voltage to all flash memory cells in the fifth row through WL<5>, and BL channel 6 outputs the programming BL voltage through BL<6>. In the conventional structure shown in FIG. 1, the programming BL voltage acts on all P flash memory cells in the sixth column, causing the programming interference to already-programmed flash memory cells in the first 4 rows of the sixth column. However, in the structure of the present disclosure, the programming selection circuit controls a path between the programming BL voltage and a BL voltage obtaining terminal of the flash memory cell located in the fifth row and the sixth column to be turned on, such that the programming BL voltage can be normally output to the flash memory cell located in the fifth row and the sixth column. However, the programming selection circuit controls the path between the programming BL voltage and the flash memory cell located in the another row and the target column to be turned off, such that the programming BL voltage is not output to a flash memory cell located in another row and the sixth column. That is, a high voltage during the programming operation does not act on a flash memory cell requiring no programming operation in each row, thereby suppressing the programming interference.

The method for using the programming selection circuit to control BL voltages of flash memory cells in selected and unselected rows to suppress the programming interference in the present disclosure can be applied to both a p-type flash memory cell and an n-type flash memory cell. However, the n-type flash memory cell is turned on by applying a positive voltage to a gate. In this way, during programming, the high voltage is applied to the gate for the selected row, and a low voltage is applied to the gate for the unselected row, such that the flash memory cell is turned off. Therefore, no channel current is formed, and the programming interference is relatively small. However, for the p-type flash memory cell, a channel current is formed when the low voltage is applied to the flash memory cell in the unselected row. The p-type channel current forms a channel hot hole, and the channel hot hole induces a hot electron, which may cause a small quantity of hot electrons to be injected into a floating gate, resulting in larger interference. Therefore, considering chip area and performance balance of an entire programmable logic device, the programming selection circuit generally may not be added to the n-type flash memory cell. However, the p-type flash memory cell is more significantly affected by the aforementioned programming interference, so an advantage of adding the programming selection circuit to the p-type flash memory cell is more significant. Therefore, the present disclosure is described by using an example in which the flash memory cell is the p-type flash memory cell.

Figure 3:
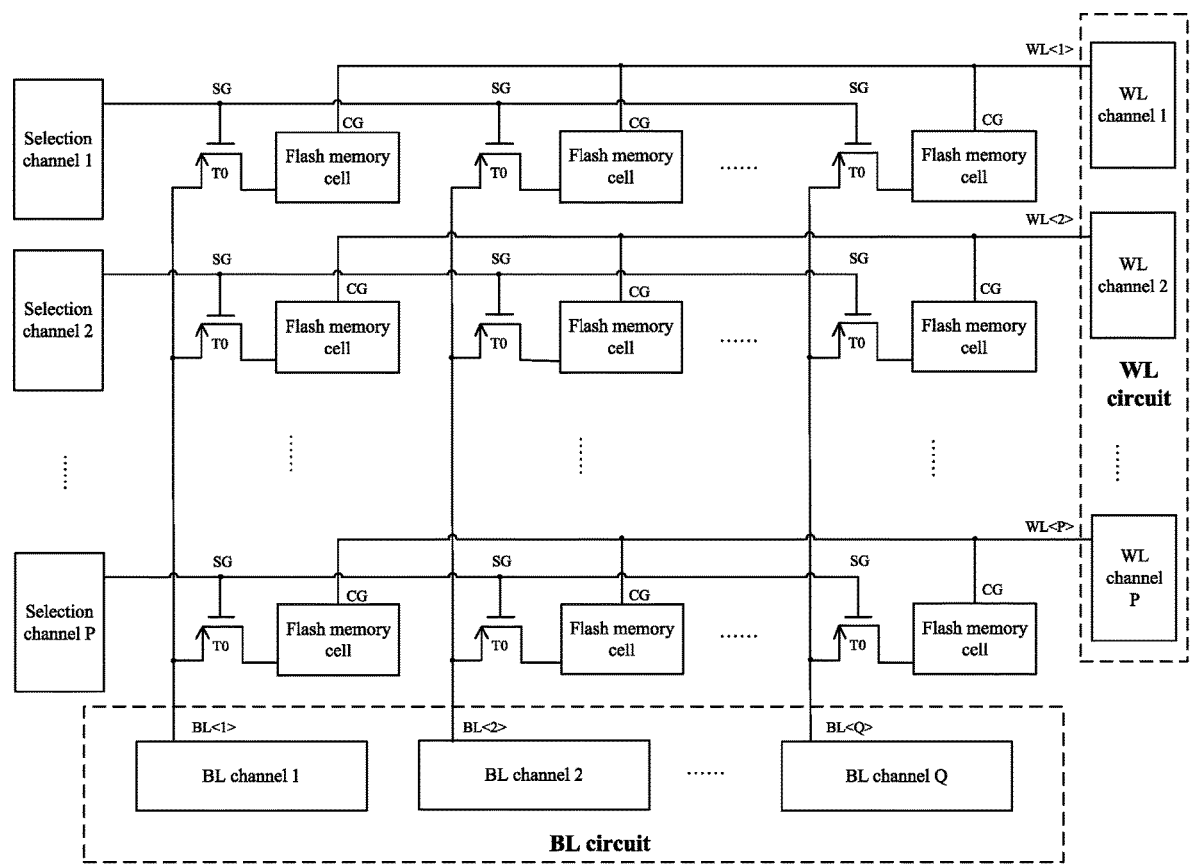
FIG. 3 is a schematic structural diagram of a memory array and a configuration control circuit inside a flash-type FPGA according to an embodiment of the present disclosure.

In order to achieve the above functions, the programming selection circuit includes a plurality of selection channels and a plurality of selection transistors T0. Each of the plurality of selection transistors T0 corresponds to one flash memory cell, a drain of the selection transistor T0 is connected to the BL voltage obtaining terminal of the corresponding flash memory cell, and sources of selection transistors T0 connected to all flash memory cells in a same column are connected to each other and connected to a BL channel corresponding to the column. Each of the plurality of selection channels corresponds to one row of the memory array, and gates of selection transistors connected to all flash memory cells in a same row are connected to each other and connected to a selection channel corresponding to the row. For example, in FIG. 3, sources of selection transistors T0 connected to flash memory cells in a first column are connected to each other and connected to the BL channel BL<1>, and gates SG of selection transistors T0 connected to flash memory cells in a first row are connected to selection channel 1. When the programming operation is performed on the flash memory cell located in the target row and the target column, the programming selection circuit outputs a valid-level selection voltage through a selection channel corresponding to the target row, and outputs an invalid-level selection voltage through a selection channel corresponding to the another row.

Figure 4:
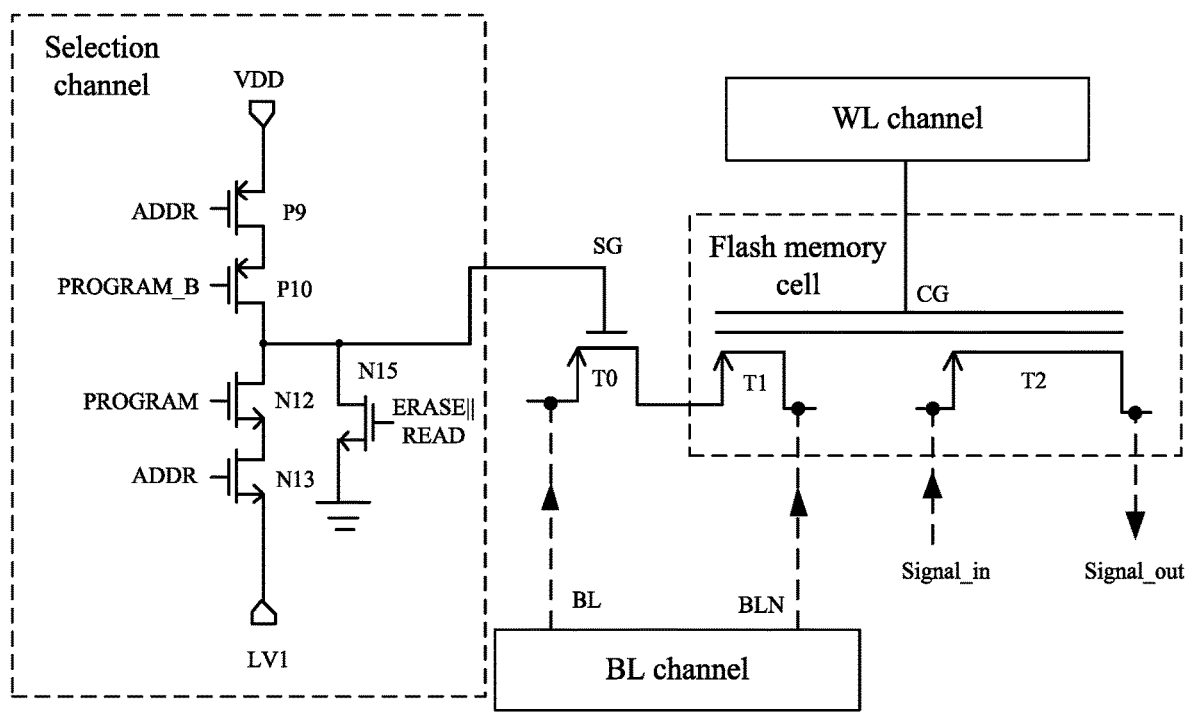
FIG. 4 is a structural circuit diagram of a selection channel according to an embodiment.

FIG. 4 shows a connection structure of a single flash memory cell. In FIG. 4, the substrate circuit and the data reading circuit are not shown. Each of the plurality selection channels includes a first programming switch transistor, a pull-up selection switch transistor, a second programming switch transistor, and a pull-down selection switch transistor. All these switches can be implemented using PMOS or NMOS transistors. The second programming switch transistor is controlled by programming operation signal PROGRAM, and the first programming switch transistor is controlled by complementary signal PROGRAM_B of the programming operation signal. Both the pull-up selection switch transistor and the pull-down selection switch transistor are controlled by gating trigger signal ADDR. Based on that high levels of both the programming operation signal PROGRAM and the gating trigger signal ADDR are valid, PMOS transistor P10 is used as the first programming switch transistor, PMOS transistor P9 is used as the pull-up selection switch transistor, NMOS transistor N12 is used as the second programming switch transistor, and NMOS transistor N13 is used as the pull-down selection switch transistor. As shown in FIG. 4, supply voltage VDD, the pull-up selection switch transistor P9, the first programming switch transistor P10, the second programming switch transistor N12, the pull-down selection switch transistor N13, and negative high voltage LV1 are sequentially connected, and a common terminal of the first programming switch transistor P10 and the second programming switch transistor N12 is led out to connect the gates SG of the selection transistors T0 connected to the flash memory cells in the corresponding row.

In this case, based on FIG. 4, when the programming operation is performed on the flash-type FPGA, the programming operation signal PROGRAM has a valid level, second programming switch transistors N12 of all the selection channels are turned on, and first programming switch transistors P10 of all the selection channels are turned on.

Gating trigger signal ADDR in the selection channel corresponding to the target row has the valid level. The pull-down selection switch transistor N13 in the current selection channel is turned on, and the pull-up selection switch transistor P9 in the current selection channel is turned off to form a path among the LV1, the N13, and the N12. The current selection channel outputs the negative high voltage LV1 to gate SG of selection transistor T0 connected to the flash memory cell in the target row to turn on the selection transistor T0 connected to the flash memory cell in the target row. Gating trigger signal ADDR in the selection channel corresponding to the another row has an invalid level. The pull-down selection switch transistor P9 in the selection channel is turned on, and the pull-up selection switch transistor N13 in the selection channel is turned off. In this case, a path among the VDD, the P9, and the P10 is formed for all other selection channels. The supply voltage VDD is output to gate SG of selection transistor T0 connected to a flash memory cell in each row to turn off selection transistor T0 connected to the flash memory cell in the another row.

Specifically, the pull-up selection switch transistor includes the PMOS transistor P9, and the pull-down selection switch transistor includes the NMOS transistor N13. A source of the P9 is connected to the supply voltage VDD, a drain of the P9 is connected to the first programming switch transistor, and a gate of the P9 is connected to the gating trigger signal ADDR. The second programming switch transistor is connected to a drain of the N13, a source of the N13 is connected to the negative high voltage LV1, and a gate of the N13 is connected to the signal ADDR. The signal ADDR in the selection channel corresponding to the target row has the valid level, while the signal ADDR in the selection channel corresponding to the another row has the invalid level.

Figure 5:
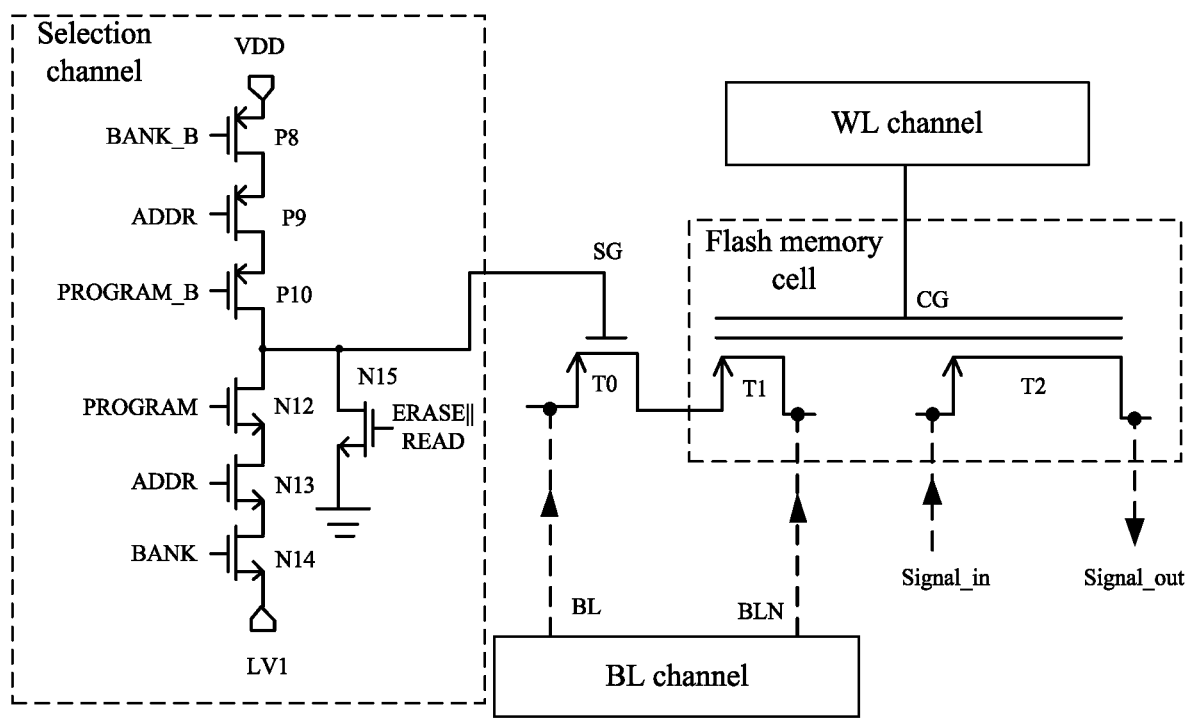
FIG. 5 is a structural circuit diagram of a selection channel according to another embodiment.

Further, in practical application, the flash-type FPGA includes a plurality of banks, and each of the plurality of banks includes a memory array. Therefore, the flash-type FPGA includes a plurality of configuration control circuits in the present disclosure, and each of the plurality of configuration control circuits is correspondingly connected to a memory array in one bank. As shown in FIG. 5, each of the plurality of selection channels further includes a first bank selection transistor and a second bank selection transistor. The first bank selection transistor is connected between the supply voltage VDD and an output terminal of the selection channel, and the second bank selection transistor is connected between the output terminal of the selection channel and the negative high voltage LV1. An example in which a high level of a bank signal is valid is used. As shown in FIG. 5, the first bank selection transistor is implemented using PMOS transistor P8, and the second bank selection transistor is implemented using NMOS transistor N14. The N14 is controlled by the bank signal, and the P8 is controlled by a BANK_B signal. Therefore, when a memory array in a bank is configured, a bank signal obtained by a configuration control circuit in the bank has the valid level, the first bank selection transistor N14 and the second bank selection transistor P8 in each selection channel within the bank are turned on. Thus, a path among the LV1, the N14, the N13, and the N12, or a path among the VDD, the P8, the P9, and the P10 can be formed.

As shown in FIG. 4 and FIG. 5, each of the plurality of selection channels further includes an erasure reading switch transistor. FIG. 4 and FIG. 5 provide description by using an example in which the erasure reading switch transistor is implemented using NMOS transistor N15. The common terminal of the first programming switch transistor P10 and the second programming switch transistor N12 is grounded through the erasure reading switch transistor N15, and the erasure reading switch transistor N15 is controlled by erasure reading signal ERASE∥READ. When the programming operation is performed on the flash-type FPGA, the programming operation signal PROGRAM has the valid level, and the erasure reading signal ERASE∥READ has the invalid level. When an erasure operation or a data reading operation is performed on the flash-type FPGA, the programming operation signal PROGRAM has the invalid level, and the erasure reading signal ERASE∥READ has the valid level. In this case, the second programming switch transistors N12 of all the selection channels are turned off, and the first programming switch transistors P10 of all the selection channels are turned off. Erasure reading switch transistors N15 of all the selection channels are turned on, and all the selection channels output 0 V. In this way, the erasure operation or the data reading operation can be implemented.

Figure 6:
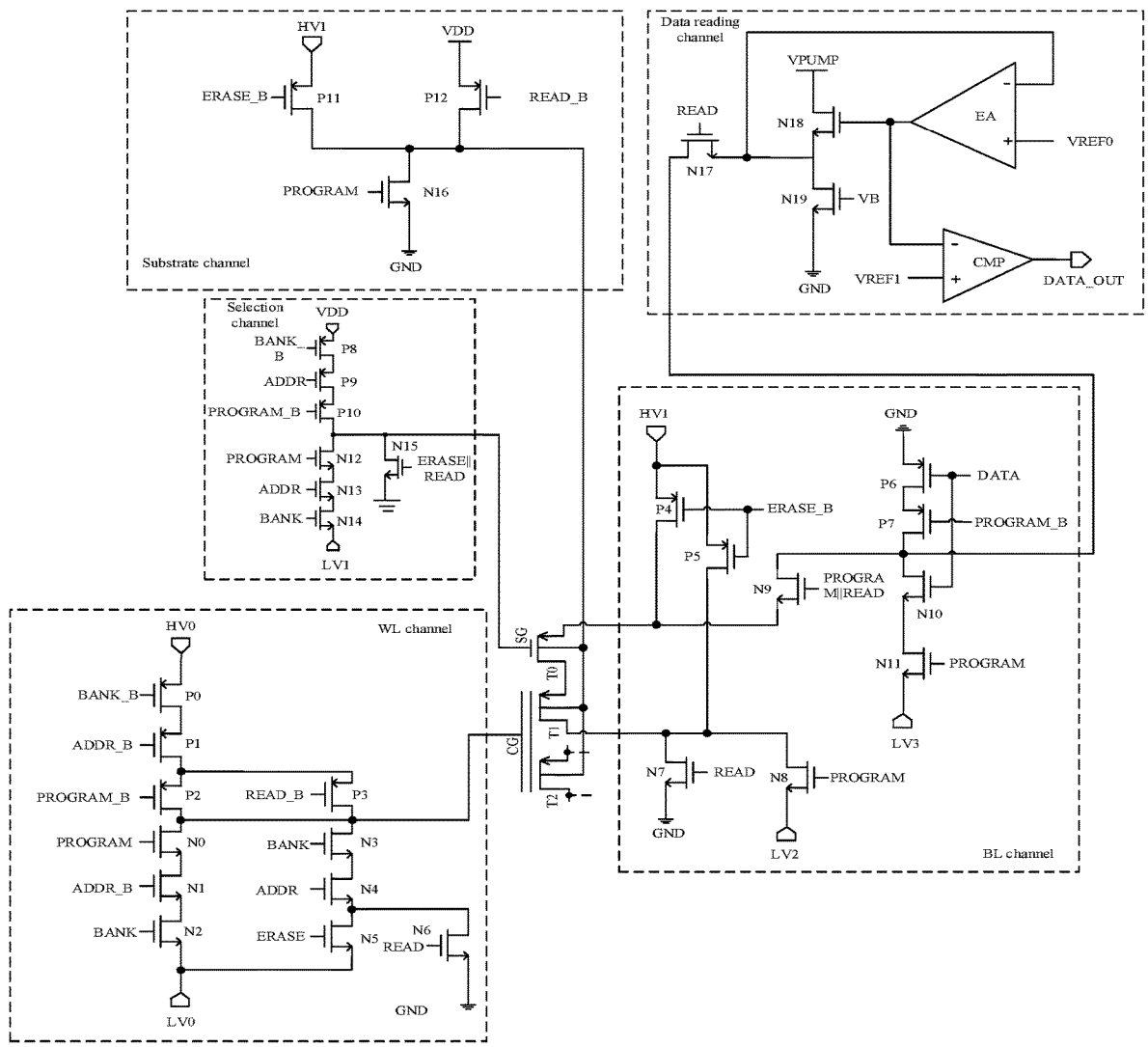
FIG. 6 shows a circuit connection between a flash memory cell and a configuration control circuit according to an embodiment.

FIG. 6 shows a specific connection between a single flash memory cell and the configuration control circuit in an embodiment. In the present disclosure, ERASE=1 indicates that the signal ERASE has the high level, PROGRAM=0 indicates that the signal PROGRAM has a low level, the signal PROGRAM and the signal PROGRAM_B are complementary signals, namely PROGRAM=−PROGRAM_B, and other signals are expressed in a similar manner. The above means of expression is adopted in following description. In addition, for each PMOS transistor, the PMOS transistor is turned on when a signal at the gate is "0" and is turned off when the signal at the gate is "1". For each NMOS transistor, the NMOS transistor is turned on when a signal at the gate is "1" and is turned off when the signal at the gate is "0". The configuration control circuit performs the configuration operation on the flash memory cell in a following manner:

A. When the erasure operation is performed on all flash memory cells:

All configuration control circuits in a bank in which the erasure operation is performed perform following configuration: ERASE=BANK=1, ERASE∥READ=1, PROGRAM=READ=0, PROGRAM∥READ=0, and ADDR=1 for all.

(1) For the WL channel, HV0=+1.5 V, and LV0=−10.0 V. In this case, N3, N4, and N5 form a path in the WL channel, and a voltage of a signal with CG=LV0 output by the WL channel is also −10.0 V.

(2) For the selection channel, VDD=+1.5 V, and LV1=0 V. In this case, the N15 forms a path in the selection channel, and a voltage of a signal with SG=GND output by the selection channel is also 0 V.

(3) For a substrate channel, HV1=+8.0 V, and VDD=+1.5 V. In this case, P11 is turned on, the P12 and N16 are turned off, and a voltage of a signal with SUB=HV1 output by the substrate channel is +8.0 V.

(4) For the BL channel, HV1=+8.0 V, LV2=0 V, and LV3=0 V. In this case, P4 and P5 are turned on, and the BL channel outputs two signals, namely the signal BL=HV1 of +8.0 V and the signal BLN=HV1 of +8.0 V.

(5) For the data reading channel, because READ=0, N17 is not turned on.

B. When the programming operation is performed:

All configuration control circuits in a bank in which the programming operation is performed perform following configuration: PROGRAM=BANK=1, ERASE∥READ=0, ERASE=READ=0, and PROGRAM∥READ=0.

1. ADDR=1 for the flash memory cell in the target row.

(1) For the WL channel, HV0=+9.5 V, and LV0=−2.5 V. In this case, P0, P1, and the P2 form a path, and the voltage of the signal with CG=LV0 output by the WL channel is +9.5 V.

(2) For the selection channel, VDD=+1.5 V, and LV1=−9.0 V. In this case, the N12, the N13, and the N14 form a path in the selection channel, and a voltage of a signal with SG=LV1 output by the selection channel is −9.0 V.

(3) For the substrate channel, HV1=+1.5 V, and VDD=+1.5 V. In this case, the N16 is turned on, and both the P11 and P12 are turned off. Therefore, a SUB signal output by the substrate channel is grounded, in other words, a voltage of the SUB signal is 0 V.

(4) For the BL channel, HV1=+1.5 V, LV2=−0.9 V, and LV3=−8.0 V In this case, N8 is turned on, and a signal with BLN=LV2 output by the BL channel is −0.9V. In addition, in this case, N9, N10, and N11 form a path, and a signal with BL=LV3 output by the BL channel is −8.0V.

(5) For the data reading channel, because READ=0, the N17 is not turned on.

2. ADDR=0 for an unselected flash memory cell in the another row.

(1) For the WL channel, HV0=+9.5 V, and LV0=−2.5 V. In this case, N0, N1, and N2 form a path, and the voltage of the signal with CG=LV0 output by the WL channel is −2.5 V.

(2) For the selection channel, VDD=+1.5 V, and LV1=−9.0 V. In this case, the P8, the P9, and the P10 form a path in the selection channel, and a voltage of a signal with SG=VDD output by the selection channel is +1.5 V.

(3) For the substrate channel, HV2=+1.5 V, and VDD=+1.5 V. In this case, the N16 is turned on, and both the P11 and the P12 are turned off. Therefore, the SUB signal output by the substrate channel is grounded, in other words, the voltage of the SUB signal is 0 V.

(4) For the BL channel, HV1=+1.5 V, LV2=−0.9 V, and LV3=−8.0 V In this case, the N8 is turned on, and the voltage of the signal with BLN=LV2 output by the BL channel is −0.9 V. In addition, in this case, the N9, the N10, and the N11 form the path, and the voltage of the signal with BL=LV3 output by the BL channel is −8.0 V.

(5) For the data reading channel, because READ=0, the N17 is not turned on.

C. When the data reading operation is performed:

All configuration control circuits in a bank in which the reading operation is performed perform following configuration: READ=BANK=1, ERASE∥READ=1, PRG∥READ=1, PROGRAM=0, and ERASE=0.

1. ADDR=1 for the flash memory cell in the target row.

(1) For the WL channel, HV0=+5.0 V, and LV0=LV1=0 V. In this case, the N3, the N4, and N6 form a path, and a voltage of a signal with CG=GND output by the WL channel is 0 V.

(2) For the selection channel, VDD=+1.5 V, and LV1=0 V. In this case, the N15 forms the path in the selection channel, and the voltage of the signal with SG=GND output by the selection channel is 0 V.

(3) For the substrate channel, HV1=+1.5 V, and VDD=+1.5 V. In this case, the P12 is turned on, both the P11 and the N16 are turned off, and a voltage of a signal with SUB=VDD output by the substrate channel is +1.5 V.

(4) For the BL channel, HV1=+1.5 V, LV2=0 V, and LV3=0 V. In this case, the N9 and the N17 in the BL channel are turned on. The drain of the transistor T0 in the p_flash memory cell is connected to the BL, and is connected to a data reading terminal of the BL channel through the N9 and the N17, and to the corresponding data reading channel. In addition, the N7 is turned on. Therefore, a voltage of a signal with BLN=GND is 0 V.

(5) For the data reading channel, since READ=1, the N17 is turned on, and the data reading channel is connected to a data reading terminal of a corresponding BL channel to obtain a current of a corresponding p_flash memory cell. When the corresponding p_flash memory cell is turned on, a voltage of a gate of NMOS transistor N18 in the data reading channel increases and is greater than second reference voltage VREF1, and an output terminal of voltage comparator CMP, which is also known as data output terminal DATA_OUT, outputs the high level. When the corresponding p_flash memory cell is turned off, the voltage of the gate of the NMOS transistor N18 in the data reading channel decreases and is smaller than the second reference voltage VREF1, and the output terminal of the voltage comparator CMP, which is also known as the data output terminal DATA_OUT, outputs the low level, so as to read the p_flash memory cell.

2. ADDR=0 for the unselected flash memory cell in the another row.

In the WL channel, HV0=±5.0 V, and LV0=LV1=0 V. In this case, the P0, the P1, and the P3 form the path, and a voltage of a signal with SG=HV1 output by the WL channel is +5.0 V.

Signal conditions for other selection channels, substrate channels, BL channels, and data reading channels are the same as those for the above flash memory cell in the target row. As the WL channel does not select the flash memory cell, the flash memory cell is not read.

In summary, when the configuration control circuit performs the programming operation, the erasure operation, and the data reading operation, a voltage at each connection terminal of the flash memory cell is shown in the following table. During the erasure operation, a voltage of control gate CG of the flash memory cell is defined as a maximum value, namely, −10.0V, the BL voltage is defined as a maximum value, namely, 8.0 V, a BLN voltage is defined as a maximum value, namely, 8.0 V, and a substrate voltage (SUB) is defined as a maximum value, namely, 8.0 V. During the programming operation, the control gate CG of the flash memory cell is defined as a maximum value, namely, 9.5 V, a voltage of the gate SG of the selection transistor T0 is defined as a maximum value, namely, −9.0V, and the BL voltage is defined as a maximum value, namely, −8.0 V.

|  |  | SG | CG | BL | BLN | SUB |
|---|---|---|---|---|---|---|
| Erasure operation | All flash memory cells | 0 V | −9.0 to −10.0 V | 7.0 to 8.0 V | 7.0 to 8.0 V | 7.0 to 8.0 V |
| Programming operation | Selected flash memory cell | −8.0 to −9.0 V | 8.0 to 9.5 V | −7.0 to −8.0 V | −0.9 V | 0 V |
|  | Unselected flash memory cell | +1.5 V | −2.5 V | −7.0 to −8.0 V | −0.9 V | 0 V |
| Data reading operation | Selected flash memory cell | 0 V | 0 V | — | 0 V | +1.5 V |
|  | Unselected flash memory cell | 0 V | +5.0 V | — | 0 V | +1.5 V |

The above described are merely preferred implementations of the present disclosure, and the present disclosure is not limited to the above embodiments. It can be understood that other improvements and modifications directly derived or associated by those skilled in the art without departing from the spirit and concept of the present disclosure should be regarded as falling within the protection scope of the present disclosure.

What is claimed is:

1. A configuration control circuit of a flash-type field programmable gate array (FPGA) capable of suppressing a programming interference, wherein the configuration control circuit comprises a word line (WL) circuit, a bit line (BL) circuit, and a programming selection circuit;

the WL circuit comprises a plurality of WL channels, and each of the plurality of WL channels corresponds to one row of a memory array, and is configured to provide a WL voltage to each flash memory cell in the corresponding row;

the BL circuit comprises a plurality of BL channels, and each of the plurality of BL channels corresponds to one column of the memory array, and is configured to provide a BL voltage to each flash memory cell in the corresponding column by using the programming selection circuit; and when a programming operation is performed on a flash memory cell located in a target row and a target column, a programming WL voltage is provided through a WL channel corresponding to the target row, and a programming BL voltage is provided through a BL channel corresponding to the target column; and the programming selection circuit controls a path between the programming BL voltage and a BL voltage obtaining terminal of the flash memory cell located in the target row and the target column to be turned on, and a path between the programming BL voltage and a BL voltage obtaining terminal of a flash memory cell located in another row and the target column to be turned off;

wherein the programming selection circuit comprises a plurality of selection channels and a plurality of selection transistors, each of the plurality of selection transistors corresponds to one flash memory cell, a drain of each of the plurality of selection transistors is connected to the BL voltage obtaining terminal of the corresponding flash memory cell, and sources of selection transistors connected to all flash memory cells in a same column are connected to each other and connected to a BL channel corresponding to the column; and each of the plurality of selection channels corresponds to one row of the memory array, and gates of selection transistors connected to all flash memory cells in a same row are connected to each other and connected to a selection channel corresponding to the row; and the programming selection circuit outputs a valid-level selection voltage through a selection channel corresponding to the target row, and outputs an invalid-level selection voltage through a selection channel corresponding to the another row;

wherein each of the plurality of selection channels comprises a first programming switch transistor, a pull-up selection switch transistor, a second programming switch transistor, and a pull-down selection switch transistor, wherein a supply voltage VDD, the pull-up selection switch transistor, the first programming switch transistor, the second programming switch transistor, the pull-down selection switch transistor, and a negative high voltage LV1 are sequentially connected, and a common terminal of the first programming switch transistor and the second programming switch transistor is led out to connect the gates of the selection transistors connected to the flash memory cells in the corresponding row;

the second programming switch transistor is controlled by a programming operation signal, the first programming switch transistor is controlled by a complementary signal of the programming operation signal, and the pull-up selection switch transistor and the pull-down selection switch transistor are controlled by a gating trigger signal;

when the programming operation is performed on the flash-type FPGA, the programming operation signal has a valid level, second programming switch transistors of all the plurality of selection channels are turned on, and first programming switch transistors of all the plurality of selection channels are turned on;

a gating trigger signal in the selection channel corresponding to the target row has the valid level, the pull-down selection switch transistor in the current selection channel is turned on, the pull-up selection switch transistor in the current selection channel is turned off, and the current selection channel outputs the negative high voltage LV1 to a gate of a selection transistor connected to the flash memory cell in the target row to control the selection transistor to be turned on; and a gating trigger signal in the selection channel corresponding to the another row has an invalid level, the pull-up selection switch transistor in the selection channel corresponding to the another row is turned on, the pull-down selection switch transistor in the selection channel corresponding to the another row is turned off, and other selection channels each output the supply voltage VDD to a gate of a selection transistor connected to a flash memory cell in each row to control the selection transistor to be turned off.

2. The configuration control circuit according to claim 1, wherein each of the plurality of selection channels further comprises an erasure reading switch transistor, wherein the common terminal of the first programming switch transistor and the second programming switch transistor is grounded through the erasure reading switch transistor, and the erasure reading switch transistor is controlled by an erasure reading signal;

when the programming operation is performed on the flash-type FPGA, the programming operation signal has the valid level and the erasure reading signal has the invalid level; when an erasure operation or a data reading operation is performed on the flash-type FPGA, the programming operation signal has the invalid level, the second programming switch transistors of all the plurality of selection channels are turned off, and the first programming switch transistors of all the plurality of selection channels are turned off; and the erasure reading signal has the valid level, erasure reading switch transistors of all the plurality of selection channels are turned on, and all the plurality of selection channels output 0 V.

3. The configuration control circuit according to claim 1, wherein the pull-up selection switch transistor comprises a P-channel metal oxide semiconductor (PMOS) transistor P9, and the pull-down selection switch transistor comprises an N-channel metal oxide semiconductor (NMOS) transistor N13, wherein a source of the P9 is connected to the supply voltage VDD, a drain of the P9 is connected to the first programming switch transistor, and a gate of the P9 is connected to the gating trigger signal ADDR; and the second programming switch transistor is connected to a drain of the N13, a source of the N13 is connected to the negative high voltage LV1, and a gate of the N13 is connected to the gating trigger signal ADDR; and the gating trigger signal ADDR in the selection channel corresponding to the target row has the valid level, while the gating trigger signal ADDR in the selection channel corresponding to the another row has the invalid level.

4. The configuration control circuit according to claim 1, wherein the flash-type FPGA comprises a plurality of configuration control circuits, and each of the plurality of configuration control circuits is correspondingly connected to a memory array in one bank of the flash-type FPGA;

each of the plurality of selection channels further comprises a first bank selection transistor and a second bank selection transistor, wherein the first bank selection transistor is connected between the supply voltage VDD and an output terminal of each of the plurality of selection channels, and the second bank selection transistor is connected between the output terminal of each of the plurality of selection channels and the negative high voltage LV1; and when a configuration operation is performed on a memory array in a bank, a bank signal obtained by a configuration control circuit in the bank has the valid level, and first bank selection transistors and second bank selection transistors in all selection channels in the bank are turned on.

* * * * *